United States Patent [19]

Negoro

[11] Patent Number: 4,692,784
[45] Date of Patent: Sep. 8, 1987

[54] DIELECTRIC INSULATION TYPE SEMICONDUCTOR INTEGRATED CIRCUIT HAVING LOW WITHSTAND VOLTAGE DEVICES AND HIGH WITHSTAND VOLTAGE DEVICES

[75] Inventor: Tatsuo Negoro, Tokyo, Japan
[73] Assignee: NEC Corporation, Tokyo, Japan
[21] Appl. No.: 599,158
[22] Filed: Apr. 11, 1984
[30] Foreign Application Priority Data Apr. 12, 1983 [JP] Japan ................................. 58-64069

[51] Int. Cl.⁴ ..................... H01L 29/06; H01L 27/12; H01L 29/04
[52] U.S. Cl. ..................................... 357/49; 357/20; 357/59; 357/88; 357/89
[58] Field of Search ................................. 357/47–50, 357/59, 63, 92, 20, 88, 89

[56] References Cited

U.S. PATENT DOCUMENTS

| | | | |
|---|---|---|---|
| 2,878,152 | 3/1959 | Runyan et al. | 357/63 |
| 3,566,220 | 2/1971 | Post | 357/49 |
| 3,722,079 | 3/1973 | Beasom | 357/49 |
| 3,954,522 | 5/1976 | Roberson | 357/49 |
| 4,146,905 | 3/1979 | Appels et al. | 357/49 |
| 4,272,307 | 6/1981 | Mayrand | 357/48 |
| 4,379,726 | 4/1983 | Kumamaru | 357/48 |

FOREIGN PATENT DOCUMENTS

| | | | |
|---|---|---|---|
| 54-127689 | 10/1979 | Japan | 357/92 |
| 55-134963 | 10/1980 | Japan | 357/49 |

Primary Examiner—J. Carroll
Attorney, Agent, or Firm—Burns, Doane, Swecker & Mathis

[57] ABSTRACT

At the bottom of an island region in which a low withstand voltage transistor is formed, is provided a high concentration region of the same conductivity type as the island region having a larger thickness than a high concentration region provided at the bottom of an island region in which a high withstand voltage transistor is formed, and the bottom surfaces and side surfaces of the respective island regions are fixedly secured to a polycrystalline semiconductor layer via insulator films.

8 Claims, 3 Drawing Figures

DIELECTRIC INSULATION TYPE SEMICONDUCTOR INTEGRATED CIRCUIT HAVING LOW WITHSTAND VOLTAGE DEVICES AND HIGH WITHSTAND VOLTAGE DEVICES

BACKGROUND OF THE INVENTION

1. Field of the Invention

The present invention relates to a structure of a dielectric insulation type semiconductor integrated circuit in which a plurality of monocrystalline island regions are integrated with polycrystalline silicon and semiconductor devices are formed in the respective monocrystalline island regions.

2. Description of the Prior Art

One of isolation structures for devices in a semiconductor integrated circuit is a dielectric isolation type structure. In this structure, bottom and side surfaces of a plurality of monocrystalline island regions are coated with dielectric films such as oxide films or the like. The plurality of monocrystalline island regions are integrated so as to bury these surfaces coated with dielectric films in polycrystalline silicon. Devices such as transistors and the like are formed in the respective monocrystalline island regions, and circuit wirings are applied to the devices. Further, as a structure for reducing a collector series resistance of the formed transistor, high impurity concentration regions of the same conductivity type as the respective island regions are provided along the bottom and side surfaces of the respective island regions. These respective monocrystalline island regions are produced in the same step of a process. Therefore, all the high concentration regions are formed so as to have the same thickness in common to the respective monocrystalline island regions.

If a transistor having a high withstand voltage and a transistor having a low withstand voltage are formed in the above-described dielectric isolation type semiconductor integrated circuit in the prior art, a collector series resistance of the transistor having a low withstand voltage would become larger than that of the transistor having a high withstand voltage because a depth of a base region in the former transistor is shallower than that of the latter transistor to prolong the length between the base region and the high concentration region. In order to reduce this collector series resistance of the low withstand voltage transistor, it is necessary to narrow a gap distance between the collector electrode and base region of the transistor or to elongate an opposed length of them. With regard to the gap distance, however, since it is necessary to maintain a withstand voltage of several volts to several tens volts across a base-collector junction even if the transistor is of low withstand voltage class, and so, it is necessary to leave a gap distance of about 10 ~ 30 μm. Alternatively, the reduction of the collector series resistance may be achieved by elongating the opposed length of the collector electrode and the base region, but this approach has a shortcoming that an occupation area of the device increases and a parasitic capacitance also becomes large.

SUMMARY OF THE INVENTION

It is, therefore, a primary object of the present invention to provide a dielectric isolation type semiconductor integrated circuit in which a transistor having a low withstand voltage but a small collector series resistance and a transistor having a high withstand voltage are formed.

Another object of the present invention is to provide a dielectric isolation type semiconductor integrated circuit in which transistors having a low withstand voltage as well as transistors having a high withstand voltage are integrated at a high integration density.

According to one feature of the present invention, there is provided a dielectric isolation type semiconductor integrated circuit including a predetermined number of first monocrystalline island regions, a predetermined number of second monocrystalline island regions, dielectric films coating the bottom surfaces and side surfaces of the first and second monocrystalline island regions, and polycrystalline semiconductor deposited on the dielectric films to integrally connect the first and second monocrystalline island regions, in which the first and second monocrystalline island regions respectively have a high concentration part at the bottom and side portions and a low concentration part formed in contact with the high concentration part but separated from the bottom and side surfaces, the high concentration part along at least the bottom surface of the first monocrystalline island region being formed thicker than the high concentration part along the bottom surface of the second monocrystalline island region, and a transistor having a shallow base region being formed in the first monocrystalline island region, while a transistor having a deep base region being formed in the second monocrystalline island region.

Although a transistor having a shallow base region is formed in the first monocrystalline island region, a collector series resistance of the transistor is small because the thickness of the high concentration part in the first monocrystalline region is thick. Since the base region of this transistor is shallow and the thickness of the low concentration part of the collector region is also thin, it cannot have a so high withstand voltage. On the other hand, in the second monocrystalline island region, since the base region of the transistor is deep and the high concentration part of the collector region is thin (i.e., the low concentration part of the collector region is thick), the formed transistor has a high withstand voltage. Thus, a dielectric isolation type semiconductor integrated circuit in which high withstand voltage transistors as well as low withstand voltage transistors having a small collector series resistance are allowed to coexist, can be provided.

Moreover, since the collector series resistance of the low withstand voltage transistor is small, there is no need to elongate an opposed length of the collector electrode and the base region, and hence the transistor can be formed with a small occupation area. Thereby, an integration density of the dielectric isolation type semiconductor integrated circuit is improved. Furthermore, the reduction of the area necessary to form a low withstand voltage transistor implies that a parasitic capacitace of the low withstand voltage transistor is also small.

BRIEF DESCRIPTION OF THE DRAWINGS

The above and further objects, features and advantages of the present invention will become more apparent from the following detailed description of an embodiment taken in conjunction with the accompanying drawings, wherein.

DESCRIPTION OF THE INVENTION

Figure 1:
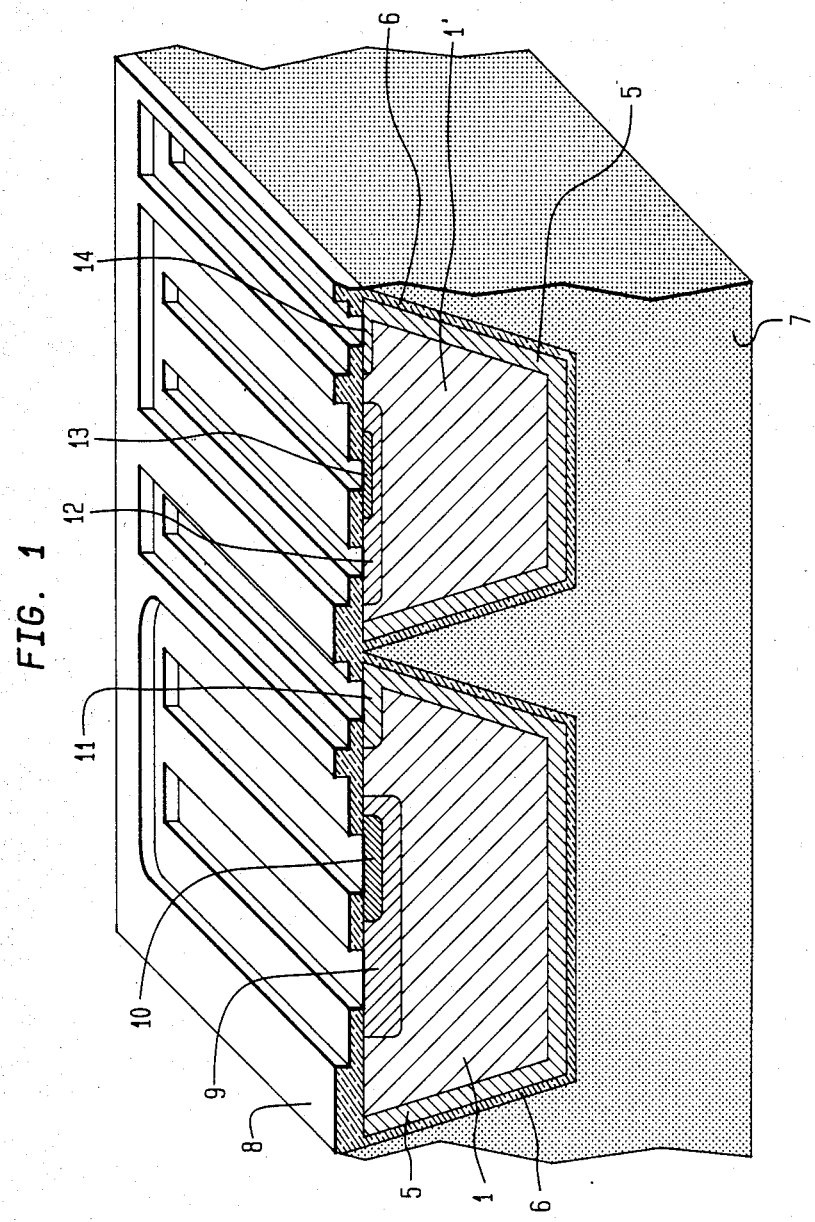
FIG. 1 is a cross-section perspective view of a dielectric isolation type semiconductor integrated circuit arrangement in the prior art.

FIG. 1 illustrates a dielectric insulation type semiconductor integrated circuit in the prior art, in which a plurality of N-type monocrystalline silicon regions 1 and 1' are formed so as to be buried in a polycrystalline silicon layer 7. Along the bottom surfaces and side surfaces of these monocrystalline silicon regions 1 and 1', N+-type high concentration regions 5 are formed. The thickness of all the high concentration regions 5 are uniform. These N+-type high concentration regions 5 are in contact with the polycrystalline silicon layer 7 via insulator films 6 made of silicon dioxide. The respective monocrystalline silicon regions 1 and 1' are electrically isolated by these insulator films 6. Generally, transistors, resistors and the like are formed in the respective monocrystalline silicon regions 1 and 1', and in the illustrated example of the prior art, a transistor having a high withstand voltage is formed in the monocrystalline silicon region 1 and a transistor having a low withstand voltage is formed in the monocrystalline silicon region 1'. The high withstand voltage transistor has a P-type base region 9 and an N+-type emitter region 10 whose diffusion depths are deep, and further it has an N+-type high concentration region 11 for leading out a collector electrode at the surface portion thereof making contact with the N+-type high concentration region 5. On the other hand, the low withstand voltage transistor has a P-type base region 12 and an N+-type emitter region 13 whose diffusion depths are shallow, and further it has an N+-type high concentration region 14 for leading out a collector electrode at the surface portion thereof making contact with the N+-type high concentration region 5. The surface of the integrated circuit is coated with an oxide film 8, in which apertures for leading out electrodes from the respective regions are provided.

Next, the method for manufacturing the dielectric isolation type semiconductor integrated circuit in the prior art will be explained. Protrusions and recesses are formed on an N-type semiconductor substrate so that the protrusions may correspond to the monocrystalline silicon regions 1 and 1'. Impurity of the N-type is diffused through the entire surface of the protrusions and recesses to form the high concentration regions 5. Thereafter, an oxide film is provided along the surfaces of the high concentration regions to form the oxide films 6, and then the substrate is coated with polycrystalline silicon 7. The opposite side of the substrate is removed by grinding until a plurality of monocrystalline silicon regions 1 and 1' are isolated from each other. Finally, several impurity diffusion processes are subjected to form transistors and circuit wiring is applied.

As is apparent from the manufacturing method, all the high concentration regions 5 are made to have a uniform thickness. Since transistors having base regions 9 and 12 of different diffusion depths are formed respectively in the monocrystalline silicon regions 1 and 1' having the high concentration regions 5 of such a uniform thickness, a collector series resistance of the transistor having the shallow base region 12 becomes undesirably large. If the thickness of the high concentration regions 5 is increased to avoid the above-mentioned shortcoming, the transistor having the deep base region 9 cannot have the necessary high withstand voltage because a depletion layer produced at the collector-base junction would readily reach the high concentration region 5. Accordingly, it is undesirable to increase the thickness of the high concentration regions 5 uniformly.

As a method for reducing a collector series resistance of a low withstand voltage transistor, a method of narrowing a gap distance between a collector electrode and a base region that is, the gap distance between the P-type base region 12 and the N+-type high concentration region 14 or a method of elongating an opposed length of these collector electrode and base region may be employed. These methods are also undesirable, because the former method lowers a withstand voltage across the collector-base junction and the latter method enlarges a necessary area for a transistor and increases a parasitic capacitance.

Figure 2:
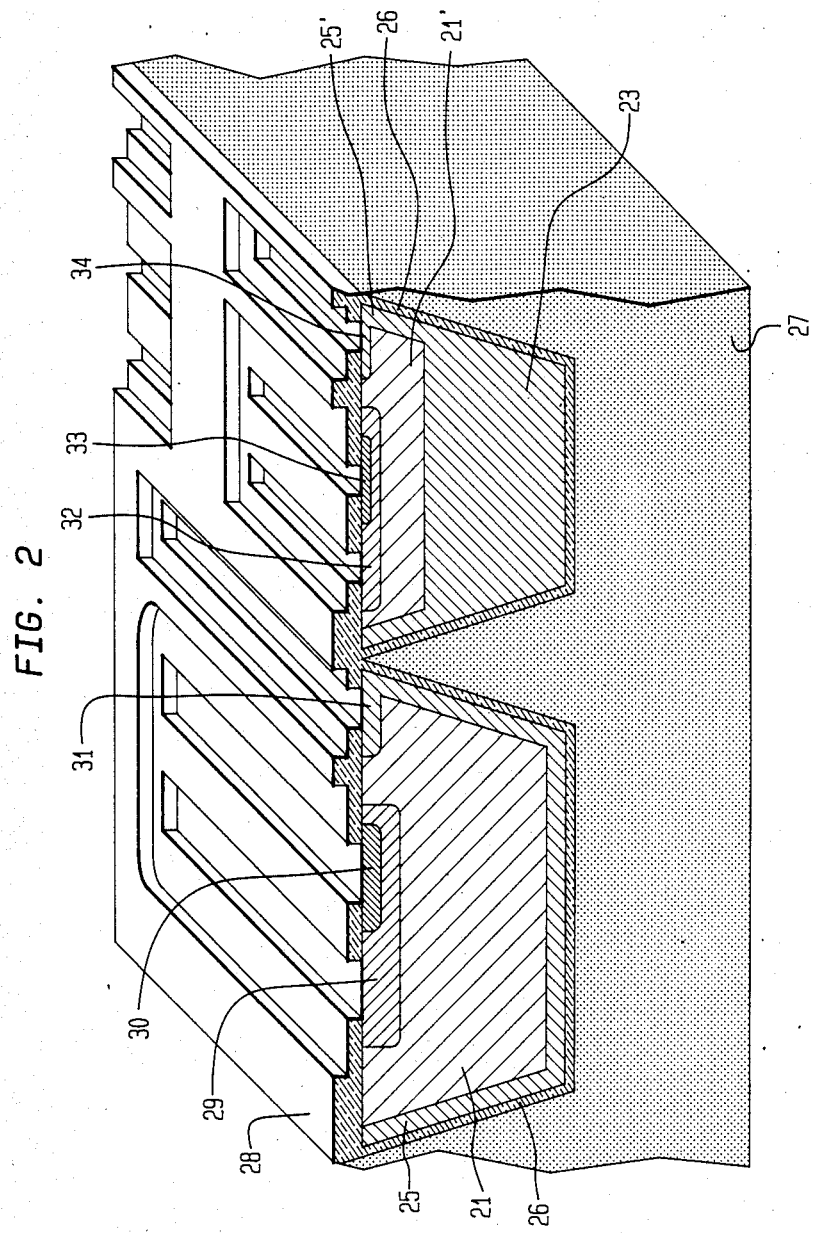
FIG. 2 is a cross-section perspective view of a dielectric isolation type semiconductor integrated circuit arrangement according to one preferred embodiment of the present invention.

With reference to FIG. 2 which shows one preferred embodiment of the present invention, a plurality of island regions buried in polycrystalline silicon 27 are electrically isolated from each other by oxide films 26 of 2.5 $\mu$m in thickness, and respectively consist of N-type monocrystalline silicon regions 21 and 21' and N+-type high concentration regions 25, 25' and 23. The respective island regions have a thickness of 55 $\mu$m, and they are formed in such dimensions that the N-type monocrystalline silicon region 21 has a thickness of 50 $\mu$m, the N-type monocrystalline silicon region 21' has a thickness of 15 $\mu$m, the N+-type high concentration regions 25 and 25' have a thickness of 5 $\mu$m, and the N+-type high concentration region 23 has a thickness of 40 $\mu$m. In addition, the respective island regions are formed in such manner that the N-type monocrystalline silicon regions 21 and 21' have an impurity concentration of $2.5 \times 10^4$ atoms/cm$^3$, the N+-type high concentration regions 25 and 25' have an impurity concentration of $1 \times 10^{17}$ atoms/cm$^3$, and the N+-type high concentration region 23 has an impurity concentration of $1 \times 10^{17}$ atoms/cm$^3$ at its peripheral portion and $4.6 \times 10^{15}$ atoms/cm$^3$ at its inner portion. In the monocrystalline silicon region 21 are formed a P-type base region 29 having an impurity concentration of $5 \times 10^{18}$ atoms/cm$^3$; and a depth of 5 $\mu$m, and an N+-type emitter region 30 having an impurity concentration of $8 \times 10^{20}$ atoms/cm$^3$ and a depth of 3.4 $\mu$m. Along the other surface of the monocrystalline silicon region 21 is formed an N+-type high concentration region 31 having the same impurity concentration and depth as the emitter region 30 and making contact with the N+-type high concentration region 25 to serve as a collector electrode lead-out region. In this way, a transistor having a high withstand voltage characteristic is formed in the monocrystalline silicon region 21.

Also, in the monocrystalline silicon region 21' are formed a P-type base region 32 having an impurity concentration of $6.5 \times 10^{18}$ atoms/cm$^3$ and a depth of 3.5 $\mu$m, an N+-type emitter region 33 having an impurity nconcentration of $8 \times 10^{20}$ atoms/cm$^3$ and a depth of 3.1 $\mu$m, and an N+-type high concentration region 34 having the same impurity concentration and depth as the emitter region 33 which is formed along the surface of the monocrystalline silicon region 21' making contact with the N+-type high concentration region 25'. The N+-type high concentration region 34 serves as a collector electrode lead-out region. In this way, a low withstand voltage NPN transistor is formed in the monocrystalline silicon region 21'.

The surface of the above structure is coated with an oxide film 28. The oxide film 28 above the monocrystalline silicon region 21 has apertures for leading out electrodes from the respective regions of the high withstand voltage transistors. The oxide film 28 has similar apertures on the monocrystalline silicon region 21' for leading out electrodes from the low withstand voltage transistor formed in the monocrystalline silicon region 21'.

According to the illustrated embodiment of the invention, the N-type monocrystalline silicon region 21'. which operates as a collector region of a low withstand voltage transistor, is small in thickness, and contacts with the N+-type high concentration region 23 having a large thickness at its bottom. Consequently, the collector series resistance of the low withstand voltage transistor is reduced to a sufficiently low value. In addition, since the N-type monocrystalline silicon region 21, which operates as a collector region of a high withstand voltage transistor, is formed to have a sufficiently large thickness, the withstand voltage of the high withstand voltage transistor is sufficiently high. Owing to the fact that both the island region 21' forming a low withstand voltage transistor and the island region 21 forming a high withstand voltage transistor have the same thickness, manufacture of the above-described integrated circuit can be carried out very easily as will be described later with reference to FIGS. 3(a) to 3(f).

Since the collector series resistance of the low withstand voltage transistor is small, the opposed length of the base region 32 and the collector electrode lead-out region 34 can be made short, and as a result, the necessary surface area of the low withstand voltage transistor is small. Accordingly, an integration density of a dielectric isolation type semiconductor integrated circuit in which low withstand voltage transistors and high withstand voltage transistors coexist, can be enhanced. Furthermore, a parasitic capacitance of the low withstand voltage transistor also can be made small because of the small necessary surface area, and so, a dielectric isolation type semiconductor integrated circuit having an excellent high frequency response can be provided.

In general, a high withstand voltage transistor has a collector withstand voltage of several tens volts to several hundreds volts, while a low withstand voltage transistor has a collector withstand voltage of several tens volts or less. A depth of the base 29 in a high withstand voltage transistor having such characteristic is 5 $\mu$m to 10 $\mu$m, while in a low withstand voltage transistor it is 2 $\mu$m to 5 $\mu$m. Accordingly, the thickness of the N-type monocrystalline silicon region 21 is selected at 25 to 70 $\mu$m, and that of the N-type monocrystalline silicon region 21' is selected at 5 to 30 $\mu$m. The N+-type high concentration region 25 and 25' should preferably have an impurity concentration of $1 \times 10^{16}$ to $1 \times 10^{18}$ atoms/cm$^3$ and a thickness of 3 to 10 $\mu$m, and the N+-type high concentration region 23 should preferably have an impurity concentration of $1 \times 10^{15}$ to $1 \times 10^{18}$ atoms/cm$^3$ and a thickness of 30 to 45 $\mu$m. The total thickness of the N-type monocrystalline silicon region 21 or 21' and the N+-type high concentration region 25 or 23 should preferably have a thickness of 30 to 80 $\mu$m.

Figure 3A:
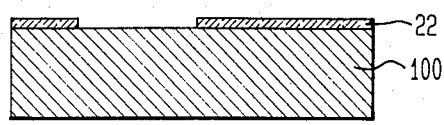
FIGS. 3(a) to 3(f) are cross-section views showing successive steps in a manufacturing process of the dielectric isolation type semiconductor integrated circuit according to one preferred embodiment of the present invention.
Figure 3B:
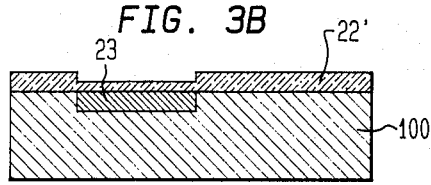
Figure 3C:
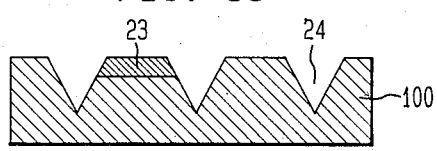
Figure 3D:
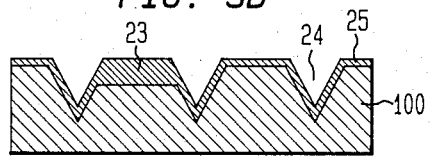
Figure 3E:
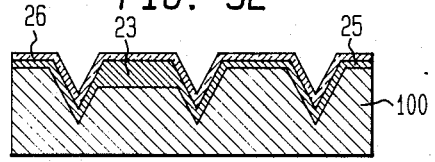
Figure 3F:
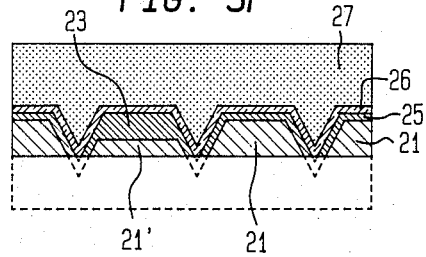

Now a method for manufacturing the dielectric isolation type semiconductor integrated circuit according to one preferred embodiment of the present invention will be described. As shown in FIG. 3(a), on a surface of an N-type silicon substrate 100 having an impurity concentration of $2.5 \times 10^{14}$ atoms/cm$^3$ is formed a silicon oxide film 22, and an aperture is opened in the silicon oxide film 22 at a portion where a low withstand voltage transistor should be formed. An N-type impurity having a large diffusion constant such as phosphorus and the like is diffused into the substrate through the aperture in the silicon oxide film 22 up to a concentration of $4.6 \times 10^{15}$ atoms/cm$^3$, and thereby an N+-type high concentration region 23 is formed as shown in FIG. 3(b). During this diffusion step, the silicon oxide film 22 is thickened as shown as a silicon oxide film 22'. This silicon oxide film 22' is partly removed, then the substrate 100 is subjected to anisotropic etching using the partly removed silicon oxide film 22' as an etching mask, and thereby grooves 24 are formed as shown in FIG. 3(c). Mesa portions surrounded by the grooves 24 are the regions to be converted into the monocrystalline silicon regions 21 and 21' in FIG. 2. At the surface of predetermined one of these mesa portions, an N+-type high concentration region 23 presents. Subsequently, an N-type impurity having a small diffusion constant such as antimony, arsenic, etc. is diffused or injected through an ion implantation process into the entire surface area of the substrate on the side where the grooves 24 are present. In this way, an N+-type high impurity concentration region 25 having an impurity concentration of $1 \times 10^{17}$ atoms/cm$^3$ is formed over the entire surface (See FIG. 3(d)). Next, a silicon oxide film 26 is provided on the surface of the high impurity concentration region 25 as shown in FIG. 3(e), and thereafter a polycrystalline silicon layer 27 of about 400 $\mu$m in thickness is formed on the silicon oxide film 26 through a vapor growth process employing a vapor of silicon tetrachloride, trichlorosilane or the like. Then the back surface portion of the silicon substrate 100 is removed by grinding as shown in FIG. 3(f), and thereby a plurality of mutually isolated monocrystalline silicon regions 21 and 21' are formed. Thereafter, base regions, emitter regions and collector electrode lead-out regions are formed through diffusion processes, and thereby a dielectric isolation type semiconductor integrated circuit as shown in FIG. 2 can be obtained.

As described above, the thick N+-type high concentration region 23 in the dielectric isolation type semiconductor integrated circuit can be formed readily by selective diffusion or the like of an impurity into the silicon substrate 100, and hence there is no addition of a difficult process at all as compared to the process for manufacturing of the dielectric isolation type semiconductor integrated circuit in the prior art. Thus, a dielectric insulation type semiconductor integrated circuit in which low withstand voltage transistors having a small collector series resistance and high withstand voltage transistors coexist, can be manufactured very easily.

While the present invention has been described above in connection with one preferred embodiment thereof, it is apparent that the present invention should not be limited to the illustrated embodiment. For instance, the N-type monocrystalline silicon regions 21 and 21' in the respective island regions could be modified into P-type monocrystalline silicon regions. In this modified case, the thick high concentration region 23 provided at the bottom of the island region is formed by making use of a P-type impurity having a large diffusion constant such as gallium, aluminum, etc., and the thin high concentration regions 24 and 25' provided along the side surfaces of the island regions are formed by making use of a P-type impurity having a small diffusion constant such as boron or the like. Moreover, the monocrystalline silicon regions 21 and 21' in the respective island regions are not limited to one conductivity type of either N-type or P-type, but N-type regions and P-type regions could coexist in one semiconductor integrated circuit. In such a modified case, a circuit employing complementary transistors can be formed, and this is useful for reduction of power consumption. Furthermore, the semiconductor forming the monocrystalline semiconductor regions 21 and 21' is not limited to silicon but other semiconductors could be employed. However, in view of easiness in manufacture, the use of silicon is advantageous.

What is claimed is:

1. A dielectric isolation type semiconductor integrated circuit, comprising:
    first and second island regions, each having bottom and side surfaces, each formed of the same conductivity type semiconductor material, and said first and second island regions having substantially the same depth;
    each island region having a first portion of a single layer with a first predetermined impurity concentration and a second portion of a single layer with a second predetermined impurity concentration higher than said first predetermined impurity concentration;
    the second portion of said first island region being thinner than the second portion of said second island region, the first portion of said first island region having a greater depth than the first portion of the second island region;
    a first base portion and a first emitter portion formed in the first portion of each of said first and second island regions, so that a high withstand voltage transistor is formed in said first island region and a low withstand voltage transistor is formed in said second island region;
    first and second insulator films coating the bottom and side surfaces of said first and second island regions, respectively; and
    a polycrystalline semiconductor layer in contact with said first and second insulator films and integrally combining said first and second island regions.

2. A dielectric isolation type semiconductor integrated circuit as claimed in claim 1, wherein:
    said first base portion of said first island region constituting said high withstand voltage transistor has a depth equal to or greater than 5 μm, and said second base portion of said second island region constituting said low withstand voltage transistor has a depth equal to or less than 5 μm.

3. A dielectric isolation type semiconductor integrated circuit as claimed in claim 2, wherein said second portion of said first island region has an impurity concentration of $1 \times 10^{16}$ atoms/cm$^3$ to $1 \times 10^{18}$ atoms/cm$^3$ and said second portion of said second island region has an impurity concentration of $1 \times 10^{15}$ to $1 \times 10^{18}$ atoms/cm$^3$.

4. A dielectric isolation type semiconductor integrated circuit as claimed in claim 2, wherein along the side surfaces of said first and second island regions are formed high impurity concentration portions of the same conductivity type as said island regions, said high impurity concentration portion along the side surface of said second island region having a smaller thickness than said second portion of said second island region.

5. A dielectric isolation type semiconductor integrated circuit as claimed in claim 4, wherein said second portion of said second island region includes impurities having high and low diffusion constants and said high impurity concentration portion in said first and second island regions and said second portion of said first island region includes an impurity having a low diffusion constant.

6. A semiconductor integrated circuit comprising a first region made of a single layer of monocrystalline semiconductor of one conductivity type, a second region made of a single layer of monocrystalline semiconductor of said one conductivity type and having a smaller thickness than said first region, a first high concentration region of said one conductivity type formed under and in contact with the bottom of said first region, a second high concentration region of said one conductivity type formed under and in contact with the bottom of said second region and having a larger thickness than said first high concentration region, a first base region of the other conductivity type formed in said first region, a second base region of said other conductivity type formed in said second region and having a smaller thickness than said first base region, a first and second emitter regions formed respectively in said first and second base regions, a first insulator film formed along the bottom surface and side surface of the region containing said first region and said first high concentration region, a second insulator film formed along the bottom surface and side surface of the region containing said second region and said second high concentration region, and a polycrystalline semiconductor layer formed under said first and second insulator films to combine said first and second regions and said first and second high concentration regions as an integrated circuit.

7. A semiconductor integrated circuit as claimed in claim 6, wherein said first high concentration region has a thickness of 3 to 10 μm and said second high concentration region has a thickness of 30 to 45 μm.

8. A semiconductor integrated circuit as claimed in claim 7, wherein said first region has a thickness of 25 μm to 70 μm, and said second region has a thickness of 5 μm to 30 μm.

* * * * *